US008853659B2

(12) United States Patent
Greenham et al.

(10) Patent No.: US 8,853,659 B2
(45) Date of Patent: Oct. 7, 2014

(54) SWITCHABLE ELECTRONIC DEVICE AND METHOD OF SWITCHING SAID DEVICE

(75) Inventors: Neil Greenham, Cambridge (GB); Jianpu Wang, Cambridge (GB)

(73) Assignee: Cambridge Display Technology Limited, Cambridgeshire (GB)

(*) Notice: Subject to any disclaimer, the term of this patent is extended or adjusted under 35 U.S.C. 154(b) by 164 days.

(21) Appl. No.: 13/266,726

(22) PCT Filed: May 4, 2010

(86) PCT No.: PCT/GB2010/000890
§ 371 (c)(1),
(2), (4) Date: Dec. 7, 2011

(87) PCT Pub. No.: WO2010/139925
PCT Pub. Date: Dec. 9, 2010

(65) Prior Publication Data
US 2012/0068140 A1    Mar. 22, 2012

(30) Foreign Application Priority Data

May 5, 2009 (GB) .................................. 0907659.7

(51) Int. Cl.
| H01L 45/00 | (2006.01) |
| H01L 21/44 | (2006.01) |
| H01L 51/40 | (2006.01) |
| G11C 13/00 | (2006.01) |
| G11C 17/16 | (2006.01) |
| G11C 11/56 | (2006.01) |
| B82Y 10/00 | (2011.01) |
| H01L 51/42 | (2006.01) |
| H01L 51/00 | (2006.01) |
| H01L 51/05 | (2006.01) |

(52) U.S. Cl.
CPC ......... H01L 51/0591 (2013.01); *H01L 51/4233* (2013.01); G11C 13/0016 (2013.01); *H01L 51/0022* (2013.01); *H01L 2251/308* (2013.01); *H01L 51/0583* (2013.01); G11C 13/0014 (2013.01); G11C 17/16 (2013.01); *G11C 2213/56* (2013.01); G11C 11/5664 (2013.01); B82Y 10/00 (2013.01); *H01L 51/0587* (2013.01); *H01L 51/0003* (2013.01); G11C 17/165 (2013.01); *G11C 2213/55* (2013.01); *H01L 51/0037* (2013.01)
USPC ...... 257/2; 257/5; 257/40; 257/642; 257/537; 257/759; 438/99; 438/597; 438/623; 438/725

(58) Field of Classification Search
USPC ............ 257/2, 5, 40, 642, 759, 537, E45.001, 257/E51.024, E21.476; 438/99, 597, 623, 438/725
See application file for complete search history.

(56) References Cited

U.S. PATENT DOCUMENTS

| 7,035,140 | B2 * | 4/2006 | Jackson et al. ................ 365/174 |
| 7,466,230 | B2 * | 12/2008 | Bergsmann et al. ........ 340/568.1 |
| 7,649,242 | B2 * | 1/2010 | Ufert ............................. 257/537 |
| 2004/0149552 | A1 | 8/2004 | Moeller et al. |
| 2005/0006640 | A1 * | 1/2005 | Jackson et al. .................. 257/40 |
| 2005/0157535 | A1 | 7/2005 | Jackson et al. |
| 2005/0195640 | A1 | 9/2005 | Smith et al. |
| 2006/0097250 | A1 | 5/2006 | Koyama et al. |
| 2006/0180810 | A1 * | 8/2006 | Lee et al. ......................... 257/40 |
| 2006/0245235 | A1 | 11/2006 | Krieger et al. |
| 2007/0138520 | A1 * | 6/2007 | Leenders et al. .............. 257/295 |
| 2008/0259680 | A1 * | 10/2008 | Nishide et al. ................. 365/174 |

FOREIGN PATENT DOCUMENTS

| DE | 10 2007 019260 A1 | 10/2008 |
| GB | 2 410 127 A | 7/2005 |
| WO | WO-2005/053002 A2 | 6/2005 |
| WO | WO-2006/043573 A1 | 4/2006 |
| WO | WO-2008/087566 A1 | 7/2008 |
| WO | WO-2009/022774 A1 | 2/2009 |

OTHER PUBLICATIONS

"Room Temperature Vacuum—Induced Ligand Removal and Patterning of ZnO Nanoparticles: from Semiconducting Films toward Printed Electronics" Richter, et. al. J. Mat. Chem. 2010, 20, 874-879.*

Brito et al., "Ultralow Power Microfuses for Write-Once Read-Many Organic Memory Elements," *Adv. Mater.*, 20:3750-3753 (2008).

Chia et al., "Injection-Induced De-Doping in a Conducting Polymer During Device Operation: Asymmetry in the Hole Injection and Extraction Rates," *Adv. Mater.*, 19:4202-4207 (2007).

Garreau et al., "In Situ Spectroelectrochemical Raman Studies of Poly(3,4-ethylenedioxythiophene) (PEDT)," *Macromolecules*, 32:6807-6812 (1999).

Garreau et al., "Optical Study and Vibrational Analysis of the Poly (3,4-ethylenedioxythiophene) (PEDT)," *Synth. Met.*, 101:312-313 (1999).

Greczynski et al., "Photoelectron Spectroscopy of Thin Films of PEDOT-PSS Conjugated Polymer Blend: A Mini-Review and Some New Results," *J. Electron Spectrosc. Relat. Phenom.*, 121:1-17 (2001).

Heuer et al., "Electrochromic Window Based on Conducting Poly (3,4-ethylenedioxythiophene)-Poly(styrene sulfonate)," *Adv. Funct. Mater.*, 12:89-94 (2002).

Kim et al., "Nature of Non-Emissive Black Spots in Polymer Light-Emitting Diodes by In-Situ Micro-Raman Spectroscopy," *Adv. Mater.*, 14:206-209 (2002).

Klauk et al., "Ultralow-Power Organic Complementary Circuits," *Nature*, 445:745-748 (2007).

Moller et al., "A Polymer/Semiconductor Write-Once Read-Many-Times Memory," *Nature*, 426:166-169 (2003).

Moller et al., "Electrochromic Conductive Polymer Fuses for Hybrid Organic/Inorganic Semiconductor Memories," *J. Appl. Phys.*, 94:7811-7819 (2003).

Pacholski et al., "Self-Assembly of ZnO: From Nanodots to Nanorods," *Angew. Chem. Int. Ed.*, 41:1188-1191 (2002).

Pei et al., "Electrochromic and Highly Stable Poly(3,4-ethylendioxythiophene) Switches Between Opaque Blue-Black and Transparent Sky Blue," *Polymer*, 35:1347-1351 (1994).

Smith et al., "A Low Switching Voltage Organic-on-Inorganic Heterojunction Memory Element Utilizing a Conductive Polymer Fuse on a Doped Silicon Substrate," *Appl. Phys. Lett.*, 84(24):5019-5021 (2004).

Steudel et al., "50 MHz Rectifier Based on an Organic Diode," *Nat. Mater.*, 4:597-600 (2005).

Subramanian et al., "Printed Organic Transistors for Ultra-Low-Cost RFID Applications," *IEEE Trans. Components and Packaging Tech.*, 28:742 (2005).

Sun et al., "Solution-Processed Zinc Oxide Field-Effect Transistors Based on Self-Assembly of Colloidal Nanorods," *Nano Lett.*, 5:2408-2413 (2005).

Combined Search and Examination Report for Application No. GB0907659.7, dated Nov. 19, 2009.

Examination Report for Application No. GB0907659.7, dated Aug. 25, 2011.

International Preliminary Report on Patentability for Application No. PCT/GB2010/000890, dated Nov. 9, 2011.

International Search Report and Written Opinion for Application No. PCT/GB2010/000890, dated Sep. 27, 2010.

\* cited by examiner

*Primary Examiner* — Lex Malsawma
*Assistant Examiner* — Sheng Zhu
(74) *Attorney, Agent, or Firm* — Marshall, Gerstein & Borun LLP

(57) ABSTRACT

A switchable electronic device comprises a hole blocking layer and a layer comprising a conductive material between first and second electrodes, wherein the conductivity of the device may be irreversibly switched upon application of a current having a current density of less than or equal to 100 A $cm^{-2}$ to a conductivity at least 100 times lower than the conductivity of the device before switching. The conductive material is a doped organic material such as doped optionally substituted poly(ethylene dioxythiophene).

38 Claims, 7 Drawing Sheets

SWITCHABLE ELECTRONIC DEVICE AND METHOD OF SWITCHING SAID DEVICE

FIELD OF THE INVENTION

The invention relates to irreversibly switchable and electronically switched devices, memory arrays comprising these devices, and methods of forming the same.

BACKGROUND

Write once read many times (WORM) memory devices may be employed for storage of data or multimedia such as music or video. Moreover, for large-volume, disposable RFID applications, write-once-read-many-times WORM memory is sufficient. Radio frequency identification (RFID) tags are an attractive application for printed organic circuits (1), especially when the circuit can be printed directly on the same substrate as the antenna used to power the circuit (2-4). RFID tags require a memory function which can be programmed and read using the power taken from the radio frequency field, needing very low current consumption and operating voltage.

Moller et al (5) discloses a solution-processed WORM device based on polyethylenedioxythiophene doped with polystyrene sulfonic acid (PEDOT:PSS), wherein a PEDOT:PSS thin film is deposited on a p-i-n silicon structure. Voltage pulses (8-10 V) and large current densities (of the order of hundreds of amps per square centimeter) are needed to program the memory arrays of this device by irreversibly reducing conductivity of the PEDOT:PSS layer. Moller et al discloses that the current density remains reversible at 0-2 V and that permanent conductivity changes are small (ca. 3-5 times lower) at 4V.

US 2005/157535 discloses a WORM device comprising an organic polymer layer and an electron blocking layer to inhibit electrons from entering the organic-polymer layer and in order to prevent degradation of the organic polymer layer due to repeated read access.

Brito et al. discloses a low-power WORM memory device in patterned micro-holes (4), but the lithography process raises the cost and restricts the applicability of this type of device.

It is therefore an object of the invention to provide a WORM memory device having a memory array that may be programmed at a lower current density and/or voltage.

It is a further object of the invention to provide a WORM device that may be manufactured at low cost.

SUMMARY OF THE INVENTION

In a first aspect, the invention provides a switchable electronic device comprising a hole blocking layer and a layer comprising a conductive material between first and second electrodes, wherein the conductivity of the device may be irreversibly switched upon application of a current having a current density of less than or equal to 100 A cm$^{-2}$ to a conductivity at least 100 times lower than the conductivity of the device before switching.

In a second aspect, the invention provides a method as specified in claim 15.

Optionally, the current density is less than or equal to 50 A cm$^{-2}$. Preferably, the current density is less than or equal to 10 A cm$^{-2}$; less than or equal to 1 A cm$^{-2}$; less than or equal to 0.5 A cm$^{-2}$; or less than or equal to 0.2 A cm$^{-2}$.

Optionally, the conductive material switches from a first state to a second state upon application of the current density of less than or equal to 100 A cm$^{-2}$. Optionally, the conductive material changes oxidation state in switching from the first to second state. Optionally, the conductive material in its first state is a doped organic material, more preferably a p-doped organic material.

Optionally, the doped organic material is a polymer.

Optionally, the polymer is optionally substituted poly(ethylene dioxythiophene). Optional substituents include alkyl or alkoxy groups.

Optionally, the dopant is a p-dopant. Optionally, the dopant comprises an anion. Optionally, the dopant is a polyanion. Suitable polyanions include deprotonated polyacids, for example polysulfonic acids.

Optionally, the dopant undergoes a chemical reaction after the conductive material switches to its second state. Optionally, the dopant is a charged species that is neutralized.

Optionally, the conductive layer comprises a source of protons. Optionally, the hole blocking layer comprises zinc oxide.

Optionally, the highest occupied molecular orbital (HOMO) level of the hole blocking layer is at least 1 eV below the HOMO level of the conductive material. Optionally, the gap is at least 1.5 eV or at least 2 eV.

For the avoidance of doubt, "below" as used herein means "further from vacuum level".

Optionally, a hole blocking layer is provided on either side of the layer of conductive material.

In a third aspect the invention provides a switchable electronic device or a switched electronic device comprising a hole blocking layer and a layer comprising a conductive material between first and second electrodes, wherein the highest occupied molecular orbital (HOMO) level of the hole blocking layer is at least 1 eV below the HOMO level of the conductive material. Optionally, the gap is at least 1.5 eV or at least 2 eV.

In a fourth aspect the invention provides an electronic device that is switchable from a first state having high conductivity to a second state having lower conductivity, or a switched electronic device derived therefrom, comprising a first electrode layer, a first hole blocking layer over the first electrode layer, a layer comprising a conductive material over the first hole blocking layer; a second hole blocking layer over the layer comprising a conductive material; and a second electrode layer over the second hole blocking layer.

In a fifth aspect the invention provides a method of forming an electronic device comprising the steps of forming a hole blocking layer and a layer comprising a conductive material between first and second electrodes layers, the device being switchable from a first state having high conductivity to a second state having lower conductivity, wherein the hole blocking layer and the layer comprising the conductive material are deposited from a solution.

The solution of the conductive material and the solution of the hole blocking material may comprise the relevant material and one or more solvents in which the material is dissolved or dispersed, and the terms "solution" and "solvent" should be construed accordingly.

Optionally, the hole blocking layer and the layer comprising the doped conductive material are deposited by spin-coating.

Optionally, at least one of the electrodes is formed by printing.

In a sixth aspect, the invention provides an electronically switched device obtainable according to the method of the first or fifth aspect.

In a seventh aspect, the invention provides a memory array comprising a plurality of switched and unswitched devices as described in any previous aspect.

It will be appreciated that a writable memory array is formed by providing an array comprising a plurality of unswitched devices, a plurality of which are then switched in order to form a written memory array.

Optionally, the array comprises a switched or unswitched device at intersections of a plurality of first electrode lines and a plurality of intersecting second electrode lines.

In an eighth aspect, the invention provides a RFID tag or data storage device comprising an array according to the seventh aspect of the invention.

It will be appreciated that optional features of one aspect of the invention may be optional features of another aspect of the invention. For example, the optional materials described in relation to the first aspect of the invention may equally be applied to the devices of the second, third or fourth aspects or the method of the fifth aspect of the invention.

DETAILED DESCRIPTION OF THE INVENTION

Figure 1A:
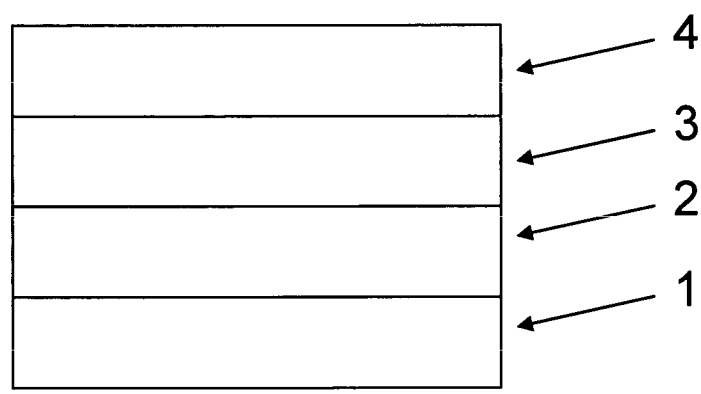
FIG. 1(a) shows the structure of a memory device according to the invention.

A device according to the invention is illustrated in FIG. 1(a) and comprises a first electrode layer 1, a hole blocking layer 2, a layer of conductive material 3 and a second electrode layer 4.

Electrodes

Electrodes may comprise any conductive material such as elemental metals (for example gold, aluminum or silver) or conducting compounds such as indium tin oxide (ITO) or indium zinc oxide. The electrode having positive voltage under positive bias preferably has a workfunction of below 4 eV, for example aluminum.

Hole Blocking Layer

The hole blocking layer has a HOMO level that is sufficiently deep as compared to the HOMO level of the conducting material to block injection of holes into the layer of conducting material. Preferably, this difference in HOMO levels is at least 1 eV, more preferably at least 1.5 or 2 eV.

Methods of measuring the HOMO levels of the conducting material and the hole blocking material will be known to the skilled person and include cyclic voltammetry and UV photoelectron spectroscopy.

Suitable materials for the hole blocking layer include wide bandgap semiconductors such as zinc oxide and titanium dioxide. Alternatively or additionally, the hole blocking layer may comprise organic hole blocking materials such as 2,9-dimethyl-4,7-diphenyl-1,10-phenanthroline (BCP), 2,2',2"-(1,3,5-phenylene)tris(1-phenyl-1H-benzimidazole) (TBPI) and bis(2-methyl-8-quinolinolato-N1,O8)-(1,1'-biphenyl-4-olato)aluminum (Balq).

The hole blocking layer may comprise a particulate layer, in particular a layer of nanoparticles.

Conductive Layer

The conductive layer preferably comprises a doped, oxidized material that may be reduced to its undoped state. One such class of materials are polycations doped with polyanions, for example an optionally substituted polythiophene such as PEDOT with a polyanion. A common class of polyanions are polyacids, for example polyacrylic acid and polysulfonates such as PSS and Nafion. Another example is polythienothiophene with a polyanion. A further example is oxidized polyaniline, for example polyaniline in its emeraldine oxidation state. A yet further example is polypyrrole. The conducting material preferably comprises a conjugated organic material, preferably a conjugated polymer.

The thickness of the conductive layer is preferably in the range 10 nm to 300 nm, more preferably in the range 30 nm to 100 nm.

Further Layers

One or more further layers may be provided between the electrode contacts, for example further hole blocking layers may be provided between the first electrode layer and the layer of conducting material, or a further hole blocking layer may be provided between the second electrode layer and the layer of conducting material.

However, in one embodiment the device comprises only the hole blocking layer and the layer comprising the conducting material between first and second contact electrodes, and in another embodiment the device comprises only the layer comprising the conducting material and a hole blocking layer either side thereof between first and second contact electrodes.

Substrate

The substrate may be of any type, for example glass or plastic. Although a patterned substrate may be used, such a substrate is not necessary according to the method of the invention.

Solution Processing

Each of the contact electrodes, the layer of conductive material and the hole blocking layer may be formed by depositing the relevant material(s) required to form that layer from a solution in one or more solvents.

In one embodiment, the hole blocking layer and the layer of conducting material are deposited from a solution.

In another embodiment, all of the aforementioned layers are deposited from a solution.

The hole blocking layer may be formed by deposition of colloidal nanoparticles of a wide-bandgap semiconductor such as ZnO.

The layer of conducting material may be formed by deposition of a solution of the conducting material, for example an aqueous dispersion in the case of PEDOT:PSS.

Contact electrodes may be formed by printing formulations comprising metal nanoparticles or metal complexes.

In forming an array, electrode lines may be deposited by a printing technique. A preferred technique is inkjet printing, although other techniques such as screen printing (any others) are also known to the skilled person.

The layer of conducting material and the layer of hole blocking material may be deposited by a coating technique such as spin-coating, dip-coating, blade coating or spray coating. Alternatively, one or both of these layers may be printed by a technique such as inkjet printing, screen printing or roll printing. Selectively printing these layers, rather than using an indiscriminate coating technique, may serve to minimize any "cross-talk" between adjacent first and second electrode intersections.

Low Power Switching

Figure 1B:
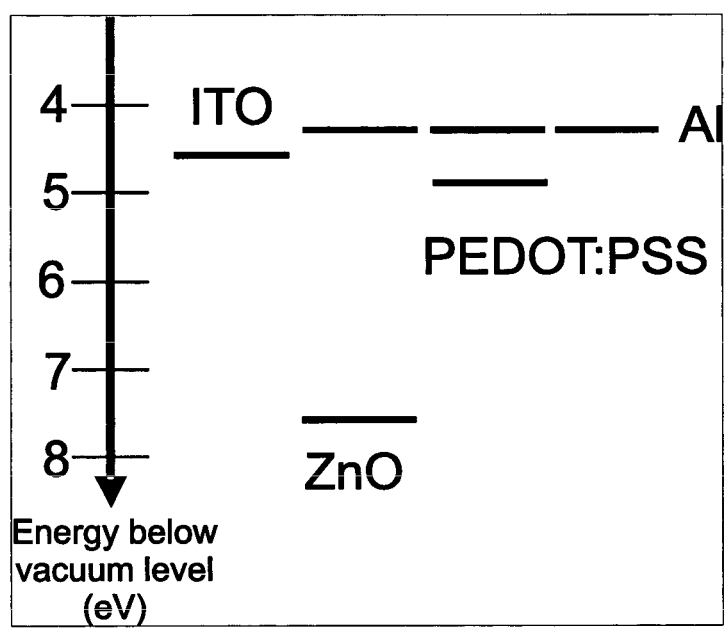
FIG. 1(b) shows the energy levels of a device having the structure of FIG. 1(a).

FIG. 1(b) is a schematic energy level diagram of an embodiment of the device of FIG. 1(a) wherein the first electrode 1 is indium tin oxide; the second electrode 4 is aluminum; the hole blocking layer 2 is formed from ZnO nanoparticles; and the conducting layer 3 comprises PEDOT:PSS.

Hole injection is suppressed by the large ionization potential (HOMO) of the hole blocking layer 2. Currents are therefore expected to be electron-dominated. Injection of electrons into a doped material such as doped PEDOT is known to lead to the reduction of PEDOT$^+$ to the neutral state PEDOT$^0$, thus lowering its conductivity (12, 13). Without wishing to be bound by any theory, it is believed that this reduction is primarily responsible for the switching in devices according to the invention. Again, without wishing to be bound by any theory, it is believed that the irreversible nature of the dedoping may be due to water present in the conductive material, which either is residual from the time the material was deposited or water that was subsequently absorbed from the atmosphere. For example, in the case of PEDOT:PSS, the PSS$^-$ during switching can react with the water to form stable neutral PSSH,

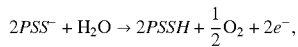

$$2PSS^- + H_2O \rightarrow 2PSSH + \frac{1}{2}O_2 + 2e^-,$$

which results in permanent reduction in conductivity of the PEDOT:PSS film (12, 14, 15).

Preferably, the time taken to program a device (or a row of an array, as the case may be) is preferably no more than 50 milliseconds.

WORM Device

Figure 5:
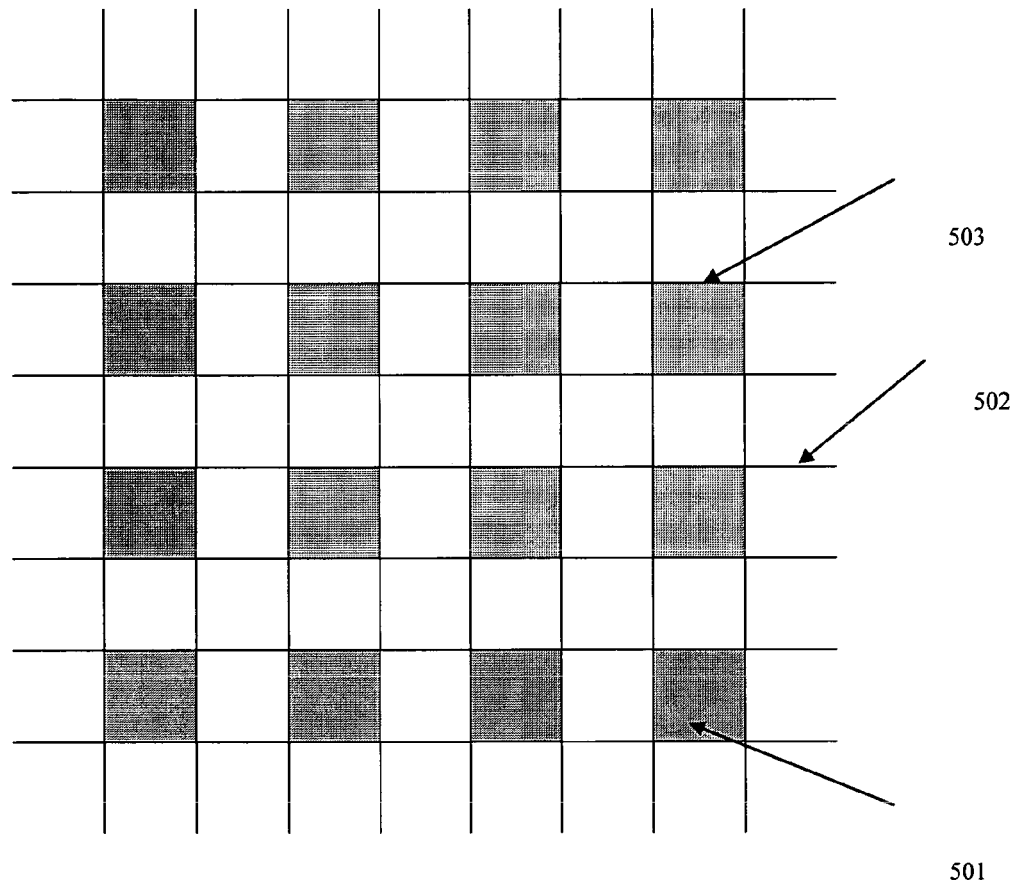
FIG. 5 shows a memory array according to the invention schematically.

A WORM memory device may be formed by providing an array of switched and unswitched devices, in particular as a two-dimensional array as illustrated in FIG. 5. The device is formed by providing a plurality of substantially parallel first electrode lines 501 and a plurality of substantially parallel second electrode lines 502 arranged to intersect the first electrode lines, in particular by arranging the first and second electrode lines substantially perpendicular to one another. Unswitched devices (i.e. relatively high conductivity) devices are provided between the first and second electrodes at first electrode-second electrode intersections, or pixels, 503. Selected pixels are subjected to the current density required to switch those pixels to their low conductivity state. A switched pixel represents one of binary 0 or 1 and an unswitched pixel represents the other of binary 0 or 1, and in this way data may be written to the array.

The thickness of each line, and the gap between each line, may be in the micrometer range, preferably in the range of 1-200 microns, preferably 5-100 microns. Patterning of the electrode layers may be formed by methods that are known to the skilled person, for example photolithographic methods and deposition through a shadow mask. The electrode layers may also be deposited by solution processing methods, as described in more detail below.

The WORM memory devices can be programmed at power densities of less than 0.1 W cm$^{-2}$. 80 µm×120 µm devices fabricated using inkjet-printed top and bottom electrodes operate at ~4V with currents of a few µA.

Example 1

A device having the structure shown in FIG. 1(a) was prepared by spin-coating ZnO nanoparticles from chloroform solution onto a patterned indium-tin oxide (ITO)-coated substrate, followed by annealing at 250° C. in air. An aqueous dispersion of PEDOT:PSS is then spin-coated to form a conducting layer, before thermal evaporation of Al top electrodes.

The ZnO nanoparticles are synthesized and prepared according to a previously reported method (6, 7), have a typical diameter of 5 nm, and are coated with n-butylamine ligands.

Figure 2A:
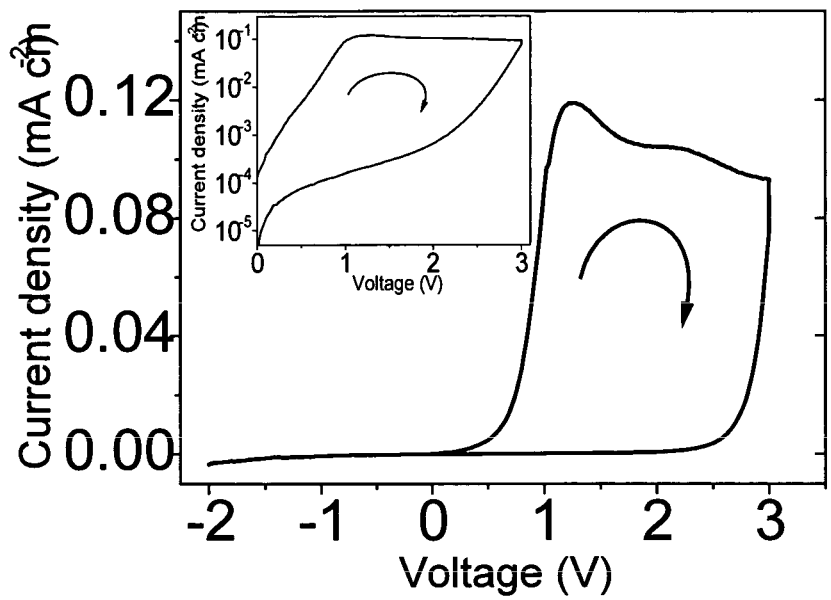
FIG. 2(a) shows the current-voltage curve for a device according to the invention.
Figure 2B:
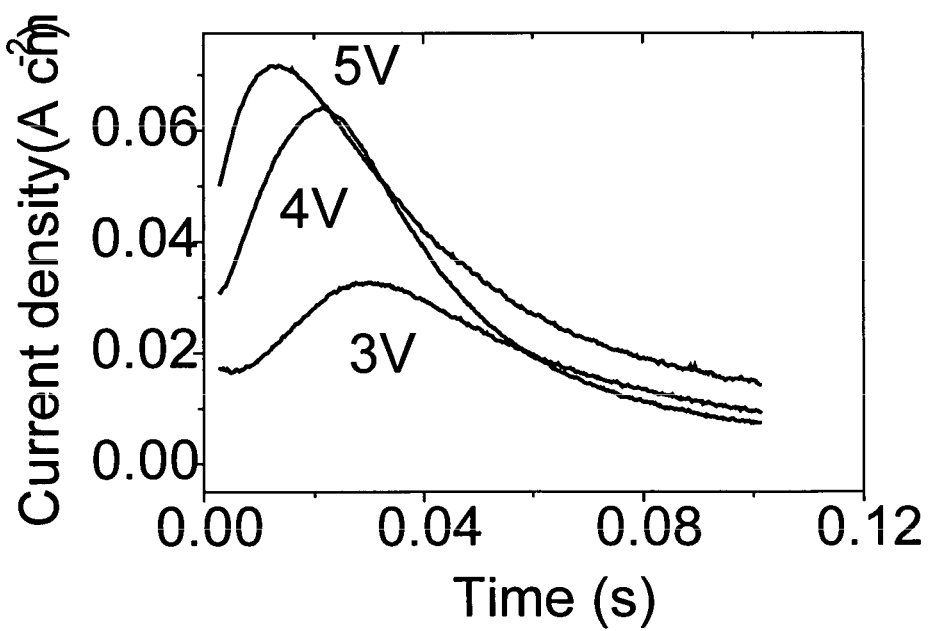
FIG. 2(b) shows the current density as a function of time for a device according to the invention.

A typical current-voltage characteristic of this type of device is shown in FIG. 2a (scan rate 0.1 V s$^{-1}$; the inset shows the same data on semilogarithmic axes). Positive bias corresponds to a positive voltage on the Al electrode. Scanning from −2V towards positive voltages, the initial J-V characteristic shows rectifying behavior, with a rectification ratio of 100 at ±1 V. Scanning further into forward bias, the current density peaks between 1.2V-2V at values of less than 1 mA cm$^{-2}$ (the exact behavior depends on the sweep rate). When sweeping back below 2 V, the current is 2-3 orders of magnitude lower than previously. The conductivity can not be recovered, indicating a permanent change to the device. FIG. 2b presents the transient current response to pulses of various voltages. It shows that the conductivity has decreased significantly in about 60 ms at 3 V, with faster decay under higher bias. FIG. 2(b) also indicates that the power density required to program the memory device can be less than 0.1 W cm$^{-2}$, which is orders of magnitude lower than previously reported ultra-low power WORM devices (4).

Figure 3A:
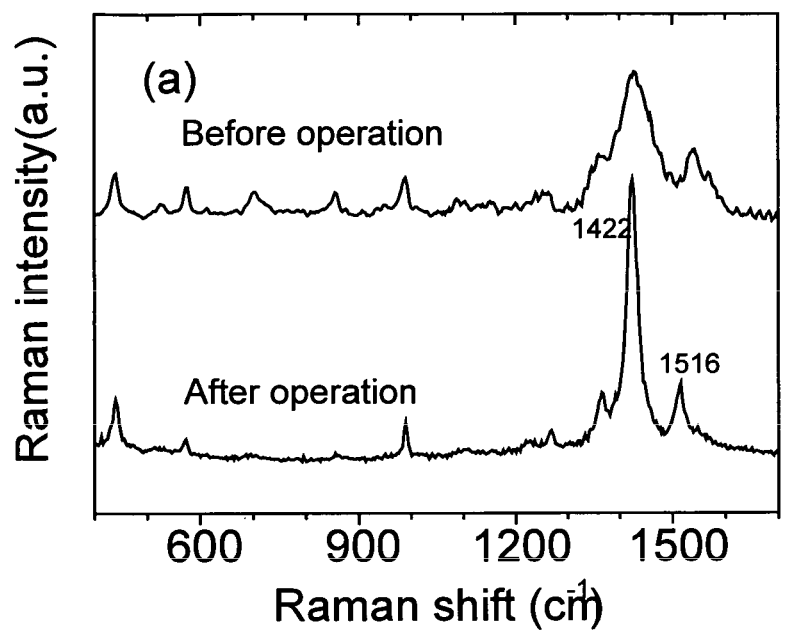
FIG. 3(a) shows Raman spectra (633 nm excitation) before and after switching a device made according to the present invention.
Figure 3B:
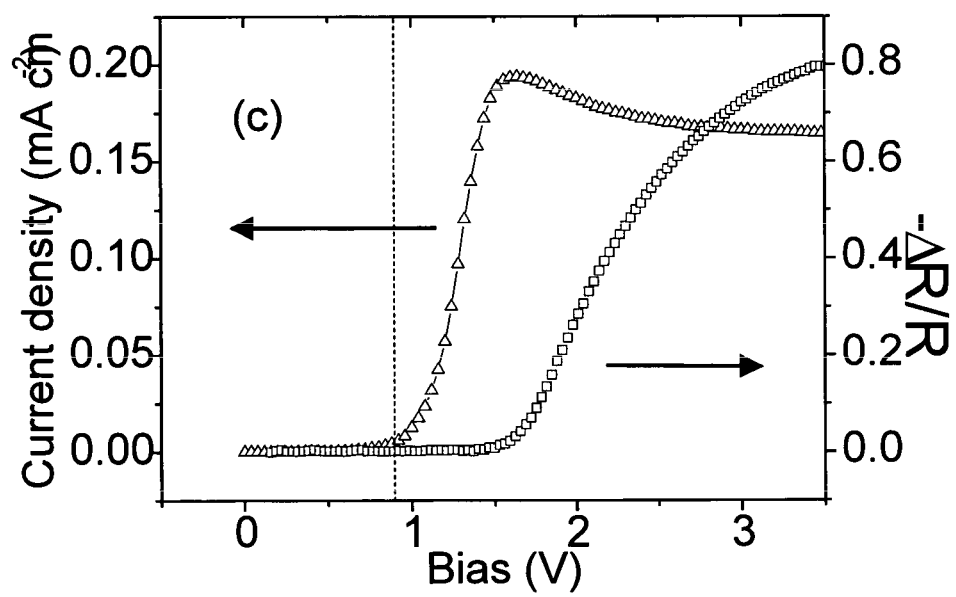
FIG. 3(b) shows reflectance at 550 nm and current density as a function of bias voltage.

To investigate the mechanism responsible for the conductance switching, Raman spectra (633 nm excitation) have been measured before and after switching (FIG. 3a). Before switching, the spectrum shows broad peaks in the region around 1420 cm$^{-1}$, whereas after switching the spectrum shows sharp peaks in this region, with clear peaks at 1422 cm$^{-1}$ and 1516 cm$^{-1}$ corresponding to symmetric and antisymmetric C=C stretching modes respectively. This change in spectrum is consistent with a change from p-doped to undoped PEDOT (8, 9). Further evidence for the dedoping of PEDOT can be obtained from the UV-visible absorbance of the devices, obtained by measuring the change in intensity of light incident through the glass substrate, passing through the PEDOT:PSS layer, and reflected at the Al electrode. The change in the conducting layer is also seen in reflectance between 375 nm and 750 nm whilst sweeping the bias from 0 to 3.5 V. In the conducting, doped state the PEDOT is highly transparent, leading to high reflectivity across the spectral range. As the bias increases, the reflectance decreases, corresponding to the formation of undoped PEDOT, which is much more absorbing (10, 11). FIG. 3(b) shows the reflectance change at 510 nm together with the current flowing in the device. It can clearly be seen that the reflectance change is associated with the reduction in current. The maximum reflectance change is over 80%, which, considering the other reflection losses present in the structure, corresponds to a very significant change in absorbance of the PEDOT. The combination of in-situ Raman and reflectance measurements therefore indicates that the change in conductivity is due to dedoping of the PEDOT. Reflectance is measured using the apparatus illustrated in FIG. 6 wherein 601 represents a white lamp; 602 represents a first lens; 603 represents a second lens; 604 represents a slit; 605 represents a grating and CCD camera; and D represents a device being measured. The device is driven continuously. The integration time is 0.38 seconds.

Example 2

Figure 4A:
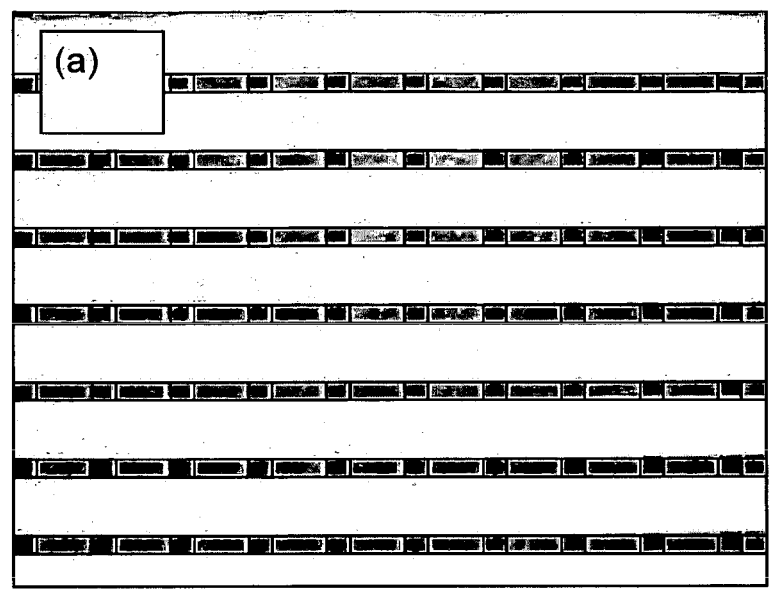
FIG. 4(a) shows an optical micrograph of an inkjet printed memory array
Figure 4B:
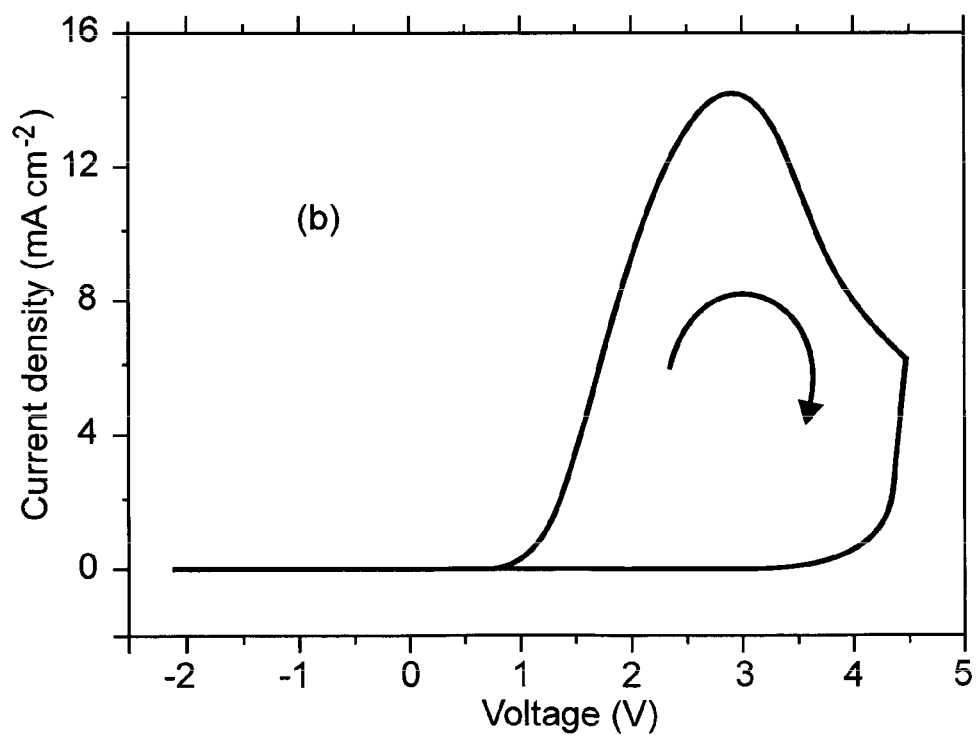
FIG. 4(b) shows the current-voltage characteristic of a single device from the array of FIG. 4(a).

In order to obtain low-cost WORM memories, it useful to fabricate arrays of devices without lithographic substrate patterning or high-vacuum processing. An additional ZnO nanoparticle hole blocking layer was inserted between the PEDOT:PSS and the top electrode, and the arrays were fabricated entirely by solution processing. Bottom electrodes were formed by inkjet printing of 120 µm wide lines of gold nanoparticle ink, followed by annealing at 250° C. for 1 hour. ZnO nanoparticle and PEDOT:PSS films were deposited as per Example 1, followed by spin-coating of a further ZnO nanoparticle layer of 200 nm thickness. The device was then annealed at 200° C. for 30 min under nitrogen. Top electrodes were deposited by inkjet printing 120 µm wide lines of a silver complex ink (perpendicular to the bottom electrode lines), followed by annealing at 130° C. for 5 minutes. FIG. 4a shows an optical micrograph of the array, and FIG. 4b shows a typical current-voltage curve of a single device (gold electrode positive). Rectifying behavior is again observed due to the difference in electrode properties. Switching occurs at 3-4 V, and the conductance in the range 1-3 V is reduced by a factor of approximately 500 after switching. This 120 µm×120 µm size printed WORM device can thus be programmed with powers of only 10 µW. Since the inkjet printed line width can be easily downscaled to 10-50 µm, it is possible that the programming power of the WORM device can be further reduced to about 1 µW. For 50 µm pitch printed lines, 1 kbits of information can be stored in a substrate area of 1.6 mm×1.6 mm, with a programming time of around 2 s, or shorter if sufficient power is available to program several devices simultaneously.

Experimental Detail for Material Preparation and Device Fabrication

ZnO nanocrystals were dissolved in chloroform solution, as ca. 30 mg/ml, and n-butylamine ligand was added. ITO substrates were thoroughly cleaned by acetone and IPA in an ultrasonic bath, followed by nitrogen gun drying and oxygen plasma (250 W, 5 min). For printed gold bottom electrodes substrate, it is cleaned by acetone and IPA rinse and nitrogen gun drying. The ZnO thin film was deposited onto the substrate by spin coating at 2000 RPM for 45 seconds, which gives film thickness about 100 nm. Then the film is annealed at 250° C. for 30 min on a hot plate in air. A PEDOT:PSS solution was spun at 4000 RPM for 1 minute to give about a film with 50 nm thickness. For 30 nm and 80 nm PEDOT:PSS thin films, spin speeds are 6000 RPM and 2000 RPM respectively. Where present, the top ZnO layer was spun from a 60 mg/ml chloroform solution and same spin condition as for the bottom ZnO layer, which gives a film thickness about 200 nm. To remove the ligands of the top ZnO layer, the samples were baked at 200° C. for 30 min on a hot plate in a nitrogen glove box. The aluminum top electrodes are deposited by thermal evaporation in high vacuum (<2×10$^{-6}$ Torr). The deposition rate is relatively slow (0.2 Å/s) for the initial 10 nm.

Experimental Detail for Inkjet Printing

Gold patterns were defined by ink-jet printing HARIMA gold nanopaste NPG-J, diluted 1 to 3-4 by vol. with xylene. For this ink formulation both Microdrop and MicroFab nozzles, with an internal diameter ranging from 20 to 40 µm, were adopted. After the printing step, the patterns were sintered into highly conductive gold by annealing at 250° C. for 1 hour on a hot plate. The roughness (RMS) of the printed gold is 3.2 nm. To define the memory grid, a second metal layer was ink-jet printed on top of the ZnO top layer. In this case a silver complex based ink, InkTec TEC-IJ-010 or InkTec TEC-IJ-050, was printed through MicroFab nozzles with an internal diameter of 30 µm. The silver lines were sintered at 130° C. for 5 minutes on a hot plate. Custom single nozzle printing systems were used with printing frequencies ranging from 4 Hz to 1 k Hz, and the processes were performed, except where differently specified, at room temperature and in ambient atmosphere.

Details of Device Characterization

Figure 6:
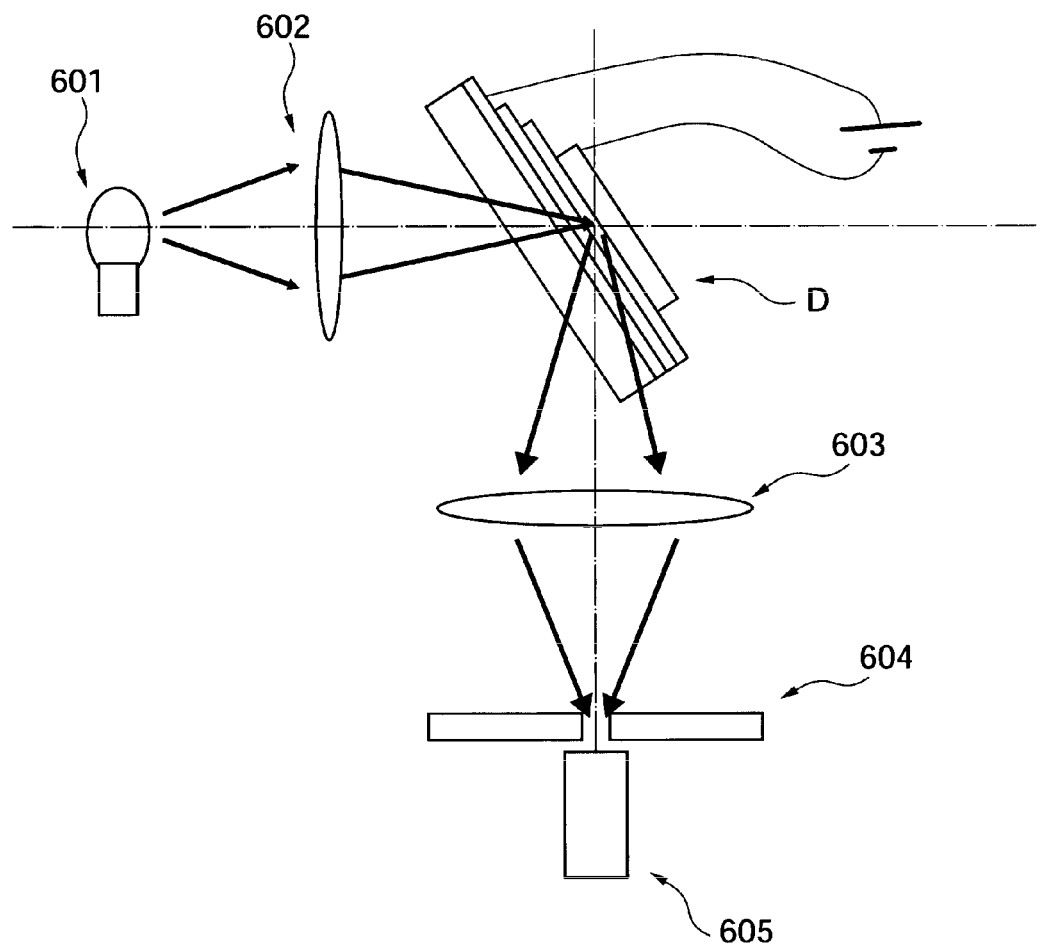
FIG. 6 shows reflectance measurement apparatus schematically

The electrical properties of the devices were characterized in air by a Keithley 236 source measurement unit with step-delay mode. The delay time is 0.2 s, the step is 0.02 V (FIG. 2(a)). The JV curves are also measured with an Agilent 4155B Semiconductor Parameter Analyzer (SPA) with pulse mode, in air. The pulse period is 20 ms, and the duration is 10 ms (FIG. 6). The transient response is measured by a HP 33120A pulse generator and an Agilent DSO60521A oscilloscope (FIG. 2(b)). Raman spectra were measured by a Renishaw 2000 Raman microscope, excited by 633 nm HeNe laser. The excitation light and Raman signal were through ITO glass substrate. The detailed setup for the device reflectivity changing measurement is shown in FIG. 6.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

REFERENCES

1. H. Klauk, U. Zschieschang, J. Pflaumm, M. Halik, *Nature* 445, 745 (2007) and US 2004/149552.
2. S. Steudel et al., *Nat Mater* 4, 597 (2005).
3. V. Subramanian, P. C. Chang, J. B. Lee, S. E. Molesa, S. K. Volkman, *IEEE Trans. Components and Packaging Tech.* 28, 742 (2005).
4. B. C. d. Brito et al., *Adv. Mater.* 20, 3750 (2008) and WO 2008/087566.
5. S. Moller, C. Perlov, W. Jackson, C. Taussig, S. R. Forrest, *Nature* 426, 166 (2003).
6. C. Pacholski, A. Kornowski, H. Weller, *Angew. Chem. Int. Ed.* 41, 1188 (2002).
7. B. Sun, H. Sirringhaus, *Nano Lett.* 5, 2408 (2005).
8. S. Garreau, G. Louarn, J. P. Buisson, G. Froyer, S. Lefrant, *Macromolecules* 32, 6807 (1999).
9. S. Garreau, G. Louam, S. Lefrant, J. P. Buisson, G. Froyer, *Synth. Met.* 101, 312 (1999).
10. Q. Pei, G. Zuccarello, M. Ahlskog, O. Inganas, *Polymer* 35, 1347 (1994).
11. H. W. Heuer, R. Wehrmann, S. Kirchmeyer, *Adv. Funct. Mater.*, 89 (2002)
12. M. Sven, R. F. Stephen, P. Craig, J. Warren, T. Carl, *J. Appl. Phys.* 94, 7811 (2003).
13. J.-S. Kim, P. K. H. Ho, C. E. Murphy, N. Baynes, R. H. Friend, *Adv. Mater.* 14, 206 (2002).
14. G. Greczynski et al., *J. Electron Spectrosc. Relat. Phenom.* 121, 1 (2001).
15. P.-J. Chia et al., *Adv. Mater.* 19, 4202 (2007).

The invention claimed is:

1. A switchable electronic device comprising a hole blocking and electron transporting layer comprising a wide bandgap semiconductor hole blocking and electron transporting material and a layer comprising a doped organic material between first and second electrodes, wherein the conductivity of the device is irreversibly switched upon application of a current having a current density of no more than 0.2 A cm$^{-2}$ to a conductivity at least 100 times lower than the conductivity of the device before switching.

2. A device as claimed in claim 1 wherein the doped organic material is switched from a first state to a second state upon application of a current density of no more than 0.2 A cm$^{-2}$.

3. A device according to claim 1 in which the doped organic material is a polymer.

4. A device according to claim 3 in which the polymer is optionally substituted poly(ethylene dioxythiophene).

5. A device according to claim 4 in which the dopant is a polyacid.

6. A device according to claim 2 in which the dopant undergoes a chemical reaction after the conductive material switches to its second state.

7. A device according to claim 1 in which the layer comprising the doped organic material comprises a source of protons.

8. A device according to claim 1 in which the hole blocking and electron transporting layer comprises nanoparticles.

9. A device as claimed in claim 1 in which the hole blocking and electron transporting layer comprises zinc oxide.

10. A device as claimed in claim 9 in which the hole blocking and electron transporting layer comprises ZnO nanoparticles having a typical diameter of 5 nm.

11. A device as claimed in claim 10 in which the ZnO nanoparticles are coated with n-butylamine ligands.

12. A device as claimed in claim 1 in which the highest occupied molecular orbital (HOMO) level of the hole blocking and electron transporting layer is at least 1 eV below the HOMO level of the doped organic material.

13. A device as claimed in claim 1, comprising a first electrode layer, a first hole blocking and electron transporting layer over the first electrode layer, the layer comprising the doped organic material over the first hole blocking and electron transporting layer; a second hole blocking and electron transporting layer over the layer comprising the doped organic material; and a second electrode layer over the second hole blocking and electron transporting layer.

14. A write once read many times (WORM) memory comprising a plurality of devices as claimed in claim 1.

15. A device according to claim 5 in which the polyacid is a polysulfonic acid.

16. A switched electronic device derived from an electronic device according to claim 13.

17. A write once read many times (WORM) memory comprising a plurality of devices as claimed in claim 13.

18. A memory array comprising a plurality of switched devices according to claim 13 and a plurality of unswitched devices.

19. A device as claimed in claim 1 wherein the hole blocking and electron transporting layer is a continuous layer.

20. A method of forming an irreversibly switched electronic device wherein conductivity of the device before switching is at least 100 times higher than conductivity of the device after switching, the device comprising a hole blocking and electron transporting layer comprising a wide bandgap semiconductor hole blocking and electron transporting material and a conductive layer comprising a switchable doped organic material between first and second electrodes, the method comprising applying an electrical current density of no more than 0.2 A cm$^{-2}$ to the device to irreversibly switch the electronic device.

21. A method according to claim 20 wherein the switchable doped organic material switches from a first state to a second state upon application of a current density of no more than 0.2 A cm$^{-2}$.

22. A method according to claim 21 wherein the doped organic material is a polymer.

23. A method according to claim 22 wherein the polymer is optionally substituted poly(ethylene dioxythiophene).

24. A method according to claim 21 wherein the dopant is a polyacid.

25. A method according to claim 21 wherein the dopant undergoes a chemical reaction after the conductive material switches to its second state.

26. A method according to claim 20 wherein the conductive layer comprises a source of protons.

27. A method according to claim 20 wherein the hole blocking and electron transporting layer comprises nanoparticles.

28. A method according to claim 20 wherein the hole blocking and electron transporting layer comprises zinc oxide.

29. A method according to claim 20 wherein the highest occupied molecular orbital (HOMO) level of the hole blocking and electron transporting layer is at least 1 eV below the HOMO level of the doped organic material.

30. A method according to claim 20 wherein the hole blocking and electron transporting layer is provided on either side of the layer of the doped organic material.

31. A method according to claim 20, further comprising forming the hole blocking and electron transporting layer and the conductive layer by solution deposition.

32. A method according to claim 31, wherein depositing the hole blocking and electron transporting layer and the conductive layer is carried out by spin-coating.

33. A method according to claim 31, further comprising forming at least one of the electrodes by printing.

34. A method according to claim 24 wherein the polyacid is a polysulfonic acid.

35. A method according to claim 32 comprising forming at least one of the electrodes by printing.

36. A memory array comprising a plurality of switched devices according to claim 1 and a plurality of unswitched devices.

37. An RFID tag or data storage device or multimedia storage device comprising a memory array according to claim 36.

38. An RFID tag or data storage device or multimedia storage device comprising a memory array according to claim 36.

* * * * *